(12) United States Patent
Reitsma et al.

(10) Patent No.: US 10,848,166 B1
(45) Date of Patent: Nov. 24, 2020

(54) DUAL MODE DATA CONVERTER

(71) Applicant: Analog Devices International Unlimited Company, Limerick (IE)

(72) Inventors: George Pieter Reitsma, Redwood City, CA (US); Andreas Koch, Wiesbaden (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/706,459

(22) Filed: Dec. 6, 2019

(51) Int. Cl.
| | |
|---|---|
| *H03M 1/12* | (2006.01) |
| *H03M 1/00* | (2006.01) |
| *H03M 1/10* | (2006.01) |

(52) U.S. Cl.
CPC .............. *H03M 1/002* (2013.01); *H03M 1/00* (2013.01); *H03M 1/10* (2013.01); *H03M 1/12* (2013.01)

(58) Field of Classification Search
CPC ............. H03M 1/12; H03M 1/10; H03M 1/00
USPC .................. 341/155, 120, 126, 158
See application file for complete search history.

(56) References Cited

U.S. PATENT DOCUMENTS

| | | | |
|---|---|---|---|
| 3,460,131 | A | 8/1969 | Gorbatenko et al. |
| 5,049,882 | A | 9/1991 | Gorecki et al. |
| 5,287,108 | A | 2/1994 | Mayes et al. |
| 5,463,395 | A | 10/1995 | Sawai |
| 6,288,668 | B1 | 9/2001 | Tsukamoto et al. |
| 7,271,757 | B2 | 9/2007 | Nakamoto et al. |
| 7,515,083 | B2 | 4/2009 | Chen et al. |
| 7,839,319 | B2 | 11/2010 | Nittala et al. |
| 8,390,497 | B2 | 3/2013 | Steensgaard-Madsen |
| 8,416,105 | B2 | 4/2013 | Lai et al. |
| 8,456,347 | B2 | 6/2013 | Wikner |
| 8,547,271 | B2 | 10/2013 | De Geronimo et al. |
| 8,854,243 | B2 | 10/2014 | Yoshioka et al. |
| 9,231,611 | B2 | 1/2016 | Steensgaard-Madsen |
| 9,966,967 | B2 | 5/2018 | Xu et al. |
| 10,151,845 | B1 | 12/2018 | Viswanath et al. |
| 10,236,902 | B1 | 3/2019 | More et al. |
| 10,481,283 | B2 | 11/2019 | Viswanath et al. |
| 2010/0001888 | A1* | 1/2010 | Nakajima ............ H03M 1/1061 341/120 |

FOREIGN PATENT DOCUMENTS

| | | |
|---|---|---|
| CN | 104796148 | 11/2017 |
| CN | 108462492 A | 8/2018 |
| JP | 6489605 B2 | 3/2019 |
| KR | 20090063951 A | 6/2009 |

OTHER PUBLICATIONS

"LTC2970/LTC2970-1—Dual I2C Power Supply Monitor and Margining Controller", Linear Technology Data Sheet, (2006), 28 pgs.
(Continued)

*Primary Examiner* — Joseph J Lauture
(74) *Attorney, Agent, or Firm* — Schwegman Lundberg & Woessner, P.A.

(57) ABSTRACT

Techniques for saving operating power of an analog-to-digital converter (ADC) are provided. In an example, a circuit can include an ADC configured to provide a multiple-bit digital representation of an analog input during a first mode of operation and an output configured to provide a single bit representation of a first comparison of the analog input signal to a second analog signal during a second mode of operation. In certain examples, the circuit can include an encoder configured to provide the multiple-bit digital representation during the first mode and to power down during the second mode of operation.

21 Claims, 5 Drawing Sheets

(56) References Cited

OTHER PUBLICATIONS

"LTC2972—2-Channel PMBus Power System Manager Featuring Programmable Power Good Outputs", Analog Devices Data Sheet, (2019), 112 pgs.
"LTC2974—4-Channel PMBus Power System Manager Featuring Accurate Output Current Measurement", Analog Devices Data Sheet, (2020), 104 pgs.
"LTC2975—4-Channel PMBus Power System Manager Featuring Accurate Input Current and Energy Measurement", Analog Devices Data Sheet, (2020), 108 pgs.
"LTC2977—8-Channel PMBus Power System Manager Featuring Accurate Output Voltage Measurement", Analog Devices Data Sheet, (2020), 92 pgs.
"LTC2978—Octal Digital Power Supply Manager with EEPROM", Linear Technology Data Sheet, (2009), 80 pgs.
"LTC2978A—8-Channel PMBus Power System Manager Featuring Accurate Output Voltage Measurement", Analog Devices Data Sheet, (2013), 82 pgs.
"LTC2979—16-Channel PMBus Low-Voltage Power System Manager", Analog Devices Data Sheet, (2018), 20 pgs.
"LTC2980—16-Channel PMBus Power System Manager", Linear Technology/ Analog Devices Data Sheet, (2015), 20 pgs.
"LTM2987—16-Channel µModule PMBus Power System Manager", Linear Technology/ Analog Devices Data Sheet, (2014), 20 pgs.
Li, Dengquan, et al., "A 1.4-mW 10-bit 150 MS/s SAR ADC With Nonbinary Split Capacitive DAC in 65 nm CMOS", IEEE Transactions on Circuits and Systems II: Express Briefs, 65(11), (2017), 5 pgs.

\* cited by examiner

DUAL MODE DATA CONVERTER

TECHNICAL FIELD OF THE DISCLOSURE

The present disclosure is related to data conversion and more particularly to techniques for an energy efficient dual mode analog-to-digital converter (ADC).

BACKGROUND

Monitoring sensors often provide an indication of an analog value. To do so, such sensors employ an analog-to-digital converter to fully convert the analog value to a digital value. The sensor may then compare the digital value to a threshold and take a predetermined course of action based on the result. The comparison can often be employed to avoid power intensive processes that do not need to be executed unless the digital value is cause for concern or is not at a level to trigger an event. However, the full conversion of the analog value to a digital value, especially in situations where the sensor may have a limited power source such as remote or mobile sensing, can represent a large portion of energy consumption of device.

SUMMARY OF THE DISCLOSURE

Techniques for saving operating power of an analog-to-digital converter (ADC) are provided. In an example, a circuit can include an ADC configured to provide a multiple-bit digital representation of an analog input during a first mode of operation and an output configured to provide a single bit representation of a first comparison of the analog input signal to a second analog signal during a second mode of operation. In certain examples, the circuit can include an encoder configured to provide the multiple-bit digital representation during the first mode and to power down during the second mode of operation.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized techniques for improving the efficiency of a monitoring sensor that conditionally may require full conversion of an analog value to a digital value. In certain examples, an ADC of a conventional monitoring sensor is slightly reconfigured to operate in a second power efficient mode as a digital comparator to detect when a full conversion is required. In certain examples, while the ADC is operating as a digital comparator, portions of the ADC associated with performing a full conversion can be power-down. Although not so limited, the techniques can provide significant power savings for sensors that employ a sequential approximation register (SAR) ADC or a flash ADC.

Applications that can take advantage of the present subject matter include, but are not limited to, remote monitoring for healthcare, remote monitoring for system health (e.g. supply, temperature), environmental monitoring (temperature, $CO_2$), etc. Such applications can benefit from low power (alarm-)level detection, as well as precisive measurements, in case an alarm condition arises. These systems are always on, hence the low power preference.

Figure 1:
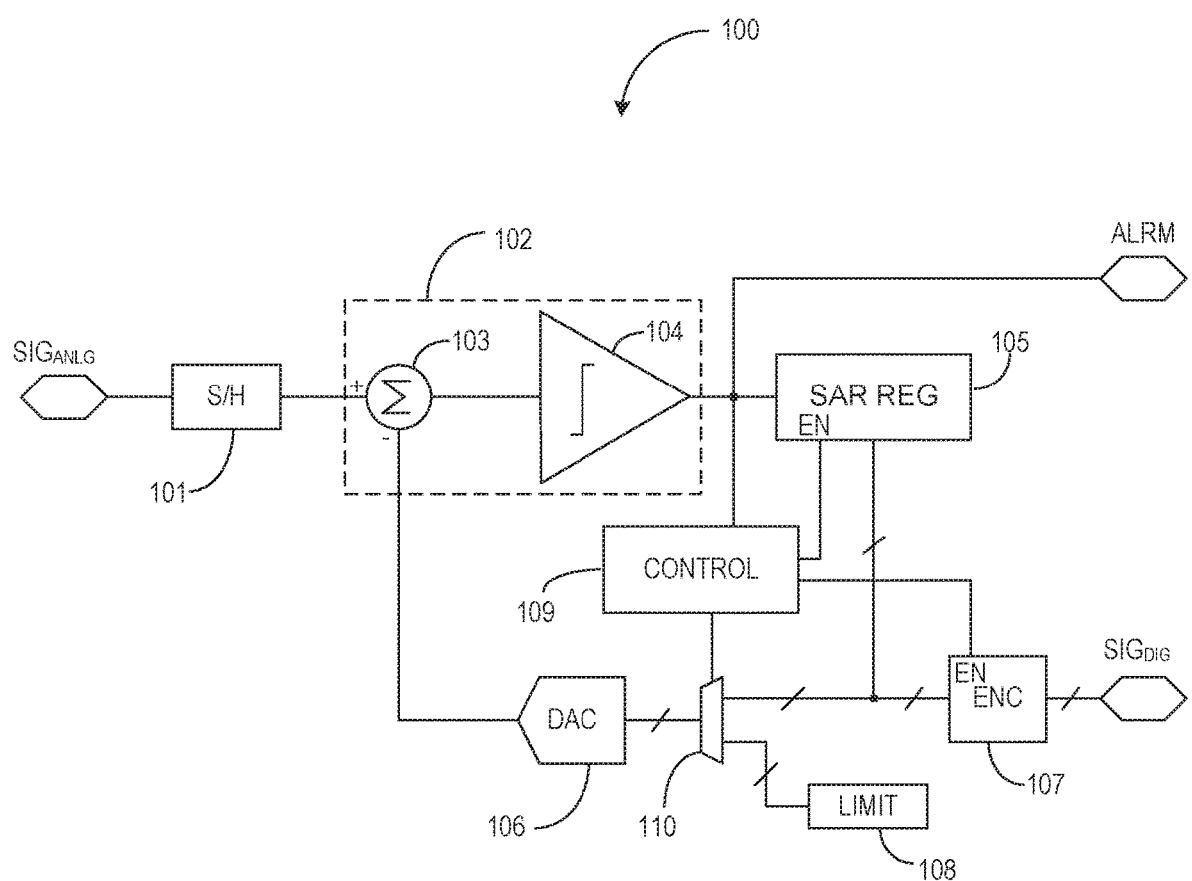
FIG. 1 illustrates generally an example of an SAR ADC according to the present subject matter.

FIG. 1 illustrates generally an example of an SAR ADC 100 according to the present subject matter. The SAR ADC 100 can include a sample and hold circuit 101, a comparator circuit 102 including an arithmetic circuit 103 and a comparator 104, a SAR register 105, a feedback digital-to-analog converter (DAC) 106 and an encoder circuit 107. It is understood, especially to those of skill in the art, the comparator 104 can include or receive a reference signal, such as a voltage, upon which to compare the output of the arithmetic circuit 103. In some examples, the reference voltage can be a ground voltage. It is also understood that the arithmetic circuit 103 can functionally be represented as a summing node in certain examples. It is also understood that a line with a slash through it as shown in FIG. 1, and in other figures of the present application, such as the output of SAR register 105 can represent multiple wires, multiple traces or multiple signal conductors. In certain examples, the feedback DAC 106 can be a capacitive DAC (CDAC). In some examples, the comparator circuit 102 can include at least a portion of a capacitor array associated with the CDAC. In addition, the SAR ADC 100 can include a threshold or limit register 108 and control circuitry 109 for switching between a first mode for providing a full digital conversion ($SIG_{DIG}$) of an analog input signal ($SIG_{ANLG}$) and a second mode for providing a comparison and binary result (ALRM) of the comparison of the analog input signal ($SIG_{ANLG}$) with a threshold provided in the limit register 108 and for powering down at least the portions of the SAR ADC not used when in the second mode. In certain examples, when the threshold is a high limit threshold for example, the SAR ADC 100 can provide full digital conversion of the analog signal ($SIG_{ANLG}$) when the level of analog signal violates the threshold. When the level of the analog signal ($SIG_{ANLG}$) does not violate the threshold, portions of the SAR ADC 100 can be powered down to conserve energy. Other portions of the SAR ADC 100 can remain active to provide a simple comparator function that can provide a binary output (ALRM) indicative of whether the level of the analog signal ($SIG_{ANLG}$) continues to remain below the threshold.

In some examples, the threshold can be a low limit threshold and the SAR. ADC 100 can provide full digital conversion of the analog signal ($SIG_{ANLG}$) when the level of analog signal violates the threshold. When the level of the analog signal ($SIG_{ANLG}$) does not violate the threshold, portions of the SAR ADC 100 can be powered down to conserve energy. In addition, when the level of the analog signal ($SIG_{ANLG}$) does not violate the threshold, other portions of the SAR ADC 100 can remain active to provide a simple comparator function that can provide a binary output (ALRM) indicative of whether the level of the analog signal ($SIG_{ANLG}$) continues to remain above the threshold.

The control circuitry 109 can enable and disable certain portions of the SAR ADC 100 and can be responsive to the value of the comparator output (ALRM). For example, assuming the comparator output (ALRM) becomes a logic high when the level of the analog signal ($SIG_{ANLG}$) violates the threshold, the control circuit 109 can include a timer circuit (not shown), such as a timer, a clock, or a timed latch, that initiates on the logic high signal and enables or powers the components of the SAR ADC 100 to provide a full digital conversion for the timed period of the latch. Upon expiration of the timed period of the latch, the full digital conversion can be disabled or powered down and the simple comparator function re-executed. Should the level of the analog signal ($SIG_{ANLG}$) still violate the threshold at the expiration of the timed period, the timed latch can be retriggered. Such an example uses very little additional circuitry compared to a conventional SAR ADC. In some examples, a second comparator separate from the SAR ADC comparator circuit 102 can be used to provide a continuously valid signal (ALRM) indicative of whether the level of the analog signal violates the threshold. In such an example, the output of the second comparator can be used to control the enabling/power-up and disabling/power down of the SAR ADC components as discussed above and can constitute the control circuitry 109. In certain examples, the SAR ADC 100 can be part of a larger system and the control circuitry 109 can be responsive to signals received from the larger system to place the SAR ADC 100 into, or out of, full digital conversion mode or in to, or out of, the low-power, comparator mode discussed above. In certain examples, the SAR ADC 100, or the control circuitry 109 can include a multiplexer 110 to control the digital value at the input of the feedback DAC 106. During the first mode, the full digital conversion mode, the multiplexer 110 can allow a value of the SAR register 105 to pass to the input of the feedback DAC 106. During the second mode, for providing a binary result (ALRM) of the comparator output, the multiplexer 110 can allow a value of the limit register 108 to pass to the input of the feedback DAC 106. In certain examples, in the second mode, the number of bit-tests (comparator-clock cycles) can be reduced to the number of alarm levels being verified. As such, the conversion time can be significantly reduced. The reduced conversion time can allow for a significant faster conversion rate and faster response time of the simplified comparator function.

Figure 2:
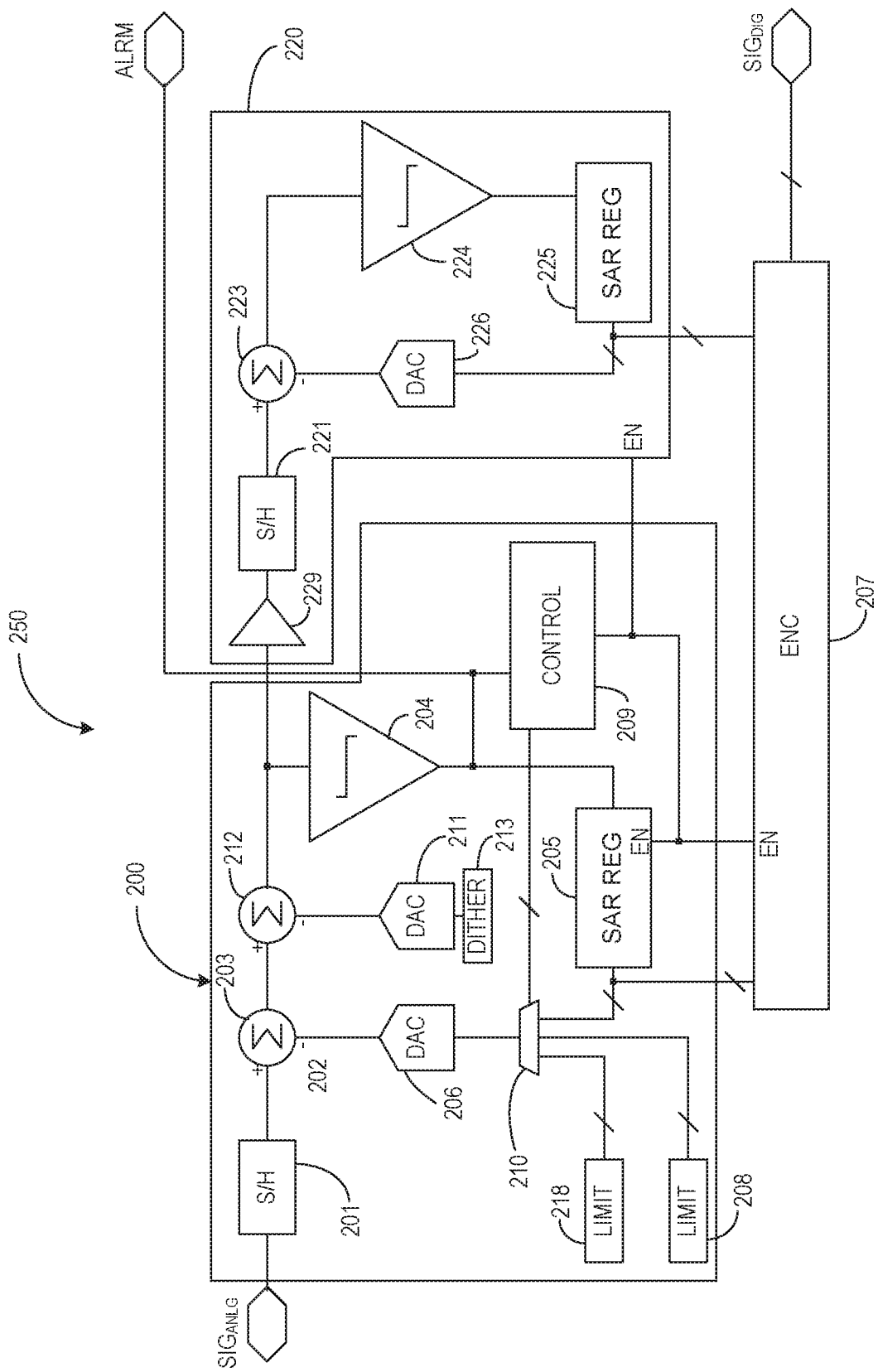
FIG. 2 illustrates generally an example pipeline SAR. ADC according to the present subject matter.

FIG. 2 illustrates generally an example pipeline SAR ADC 250 according to the present subject matter. The pipeline SAR ADC 250 can include a pair of SAR circuits 200, 220 and an encoder 207. Each SAR circuit 200 can include a sample and hold circuit 201, 221, an arithmetic circuit 203, 223, a comparator 204, 224, a SAR register 205, 225, and a feedback DAC 206, 226. One of the SAR circuits 200 can include a dither generator 213, a dither DAC 211 and a corresponding dither arithmetic circuit 212. The first SAR circuit 200 can be coupled to a second SAR circuit 220 via a residue amplifier 229. The pipeline SAR ADC 250 can provide a full digital conversion and representation ($SIG_{DIG}$) of an analog signal ($SIG_{ANLG}$) similar to the SAR ADC 100 of FIG. 1. However, the pipeline SAR ADC 250 splits the conversion into two or more binary searches. In certain examples, the pipeline SAR ADC 250 can use the feedback DAC 206 and comparator 204 of the first SAR circuit 200 to resolve a sum of the analog signal ($SIG_{ANLG}$) and a dither value to a low resolution. Due to the finite resolution of the first SAR circuit 200 a residual error of the first SAR circuit 200 can be amplified by the residue amplifier 229 and passed to the sample and hold circuit 221 of the second SAR circuit 220. The feedback DAC 226 and comparator 224 of the second SAR circuit 220 can resolve the amplified residual error. The encoder circuit 207 can receive the resolved values of each of the SAR registers 205, 225 of the SAR circuits 200, 220 and can provide a multiple-bit, digital representation ($SIG_{DIG}$) of the analog signal ($SIG_{ANLG}$). The example pipeline SAR ADC 250 can also include one or more threshold registers 208, 218, a multiplexer 210, and a controller 209. The illustrated example can include a high threshold register 208 and a low threshold register 218.

In a first mode of operation, the pipeline SAR ADC 250 can provide a full multiple-bit, digital representation ($SIG_{DIG}$) of the analog input signal ($SIG_{ANLG}$). In a second mode of operation, the pipeline SAR ADC 250 can provide a binary output (ALRM) indicative of whether the analog input ($SIG_{ANLG}$) remains within a window defined by the values of the high threshold register 208 and the low threshold register 218. In addition, during the second mode of operation, several components of the pipeline SAR ADC 250 can be disabled or powered down to conserve energy. For example, during the second mode, the encoder 207, the second SAR circuit 220 including the residue amplifier 229, and the SAR register 205 of the first SAR circuit 200 can be disabled or powered down. Although not limited as such, the second mode would typically be used when the analog signal ($SIG_{ANLG}$) is within the window, operating at a level considered to be normal, or is at a non-alarm level. In the second mode, the comparator 204 can compare the analog input signal ($SIG_{ANLG}$) to an analog representation provided by the feedback DAC 206 of the first SAR circuit 200. In certain examples, the controller 209 can alternate presentation of the digital values of the threshold registers 208, 218 to the input of feedback DAC 206. In certain examples, the controller 209 can be responsive to the output of the comparator 204 so as to enable the first mode of operation when the level of the analog signal ($SIG_{ANLG}$) passes outside the window defined by the high threshold register 208 and the low threshold register 218. In certain examples, during the first mode the controller does not inhibit operation of the full digital conversion of the analog input signal ($SIG_{ANLG}$).

In certain examples, the dither DAC 211 can also receive the output of the multiplexer 210 receiving inputs from the SAR register 205 and the threshold registers 208, 218. In such an example, the dither DAC 211 can assist in providing higher resolution of the threshold values.

Figure 3:
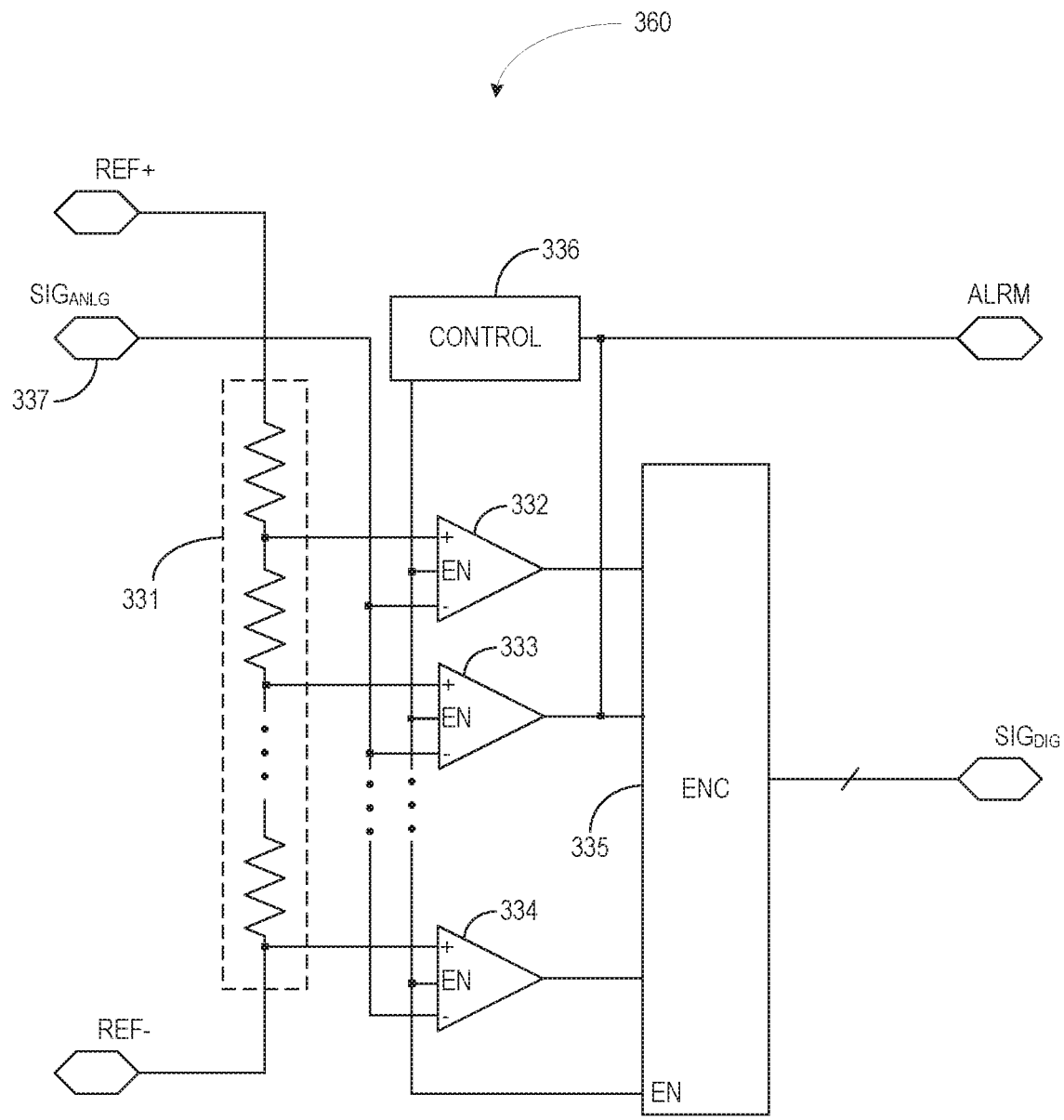
FIG. 3 illustrates generally an example of a second type of ADC, a flash ADC configured to operate in a power-efficient mode in addition to a full digital conversion mode.

FIG. 3 illustrates generally an example of a second type of ADC, a flash ADC 360 configured to operate in a power-efficient mode in addition to a full digital conversion mode. The flash ADC 360 can include a voltage divider 331 including a number of series connected resistors, a number of comparators 332, 333, 334, an encoder 335, and a controller 336. Each of the comparators 332, 333, 334 can have a first input coupled to a signal input 337 of the flash ADC 360. The signal input 337 can receive an analog signal ($SIG_{ANLG}$) of interest. A second input of the comparators 332, 333, 334 can be coupled individually to a different node of the voltage divider 331. The voltage divider 331 can include a number of resistors coupled in series between a first reference voltage (REF+) and a second reference voltage (REF−). The nodes of the voltage divider 331 coupled to the comparators 332, 333, 334 provide a decision level for each comparator upon which to base a comparison of the analog signal ($SIG_{ANLG}$) of interest. When the example flash ADC 360 is in an operating mode to provide a full digital conversion of the analog signal, the encoder 335 can receive the output of each comparator 332, 333, 334 and can provide a digital representation ($SIG_{DIG}$) of the analog signal ($SIG_{ANLG}$). Like the examples discussed above, continuously operating the flash ADC 360 to provide a full digital conversion of the analog input signal ($SIG_{ANLG}$) can consume a relatively large amount of power. If employed in a system with a limited power source, such as a battery, operation of the flash ADC can be a significant limit to the charge lifetime of the system.

In applications where the full digital conversion of the analog signal ($SIG_{ANLG}$) is not needed until it crosses a threshold, the controller 336 of the example flash ADC 360 can enable and disable portions of the flash ADC 360 to provide a second, power-efficient operating mode that provides a binary indication (ALRM) of a comparison of the analog signal ($SIG_{ANLG}$) with a predetermined decision level. The controller 336 can maintain operation of the flash ADC 360 in the second power efficient mode of operation until the comparison of the analog signal ($SIG_{ANLG}$) meets or exceeds the decision level. For example, as illustrated, assuming the flash ADC 360 is operating in the second power-efficient mode of operation, if the analog signal ($SIG_{ANLG}$) is below the decision level received by a first comparator 333, the first comparator 333 can provide a low logic signal at the output (ALRM). In the second power-efficient mode of operation, the controller 336 can disable the encoder 335 and all the comparators 332, 334, etc., except the first comparator 333, to conserve power. As the level of the analog signal ($SIG_{ANLG}$) rises past the decision level of the first comparator 333, the logic level of the output of the first comparator 333 can transition from low to high. The controller 336, while operating in the second, power efficient mode of operation, can be responsive to the transition of the output of the first comparator 333 from low to high and can transition from the second, power-efficient mode of operation to the first, full digital conversion, mode of operation. In certain examples, the controller 360 can revert back to the second mode of operation after a predetermined delay interval. In some examples, the controller 360 can optionally receive the digital representation ($SIG_{DIG}$) of the analog signal ($SIG_{ANLG}$) and can transition back to the second mode of operation when the digital representation ($SIG_{DIG}$) falls below a second predetermined value.

Figure 4:
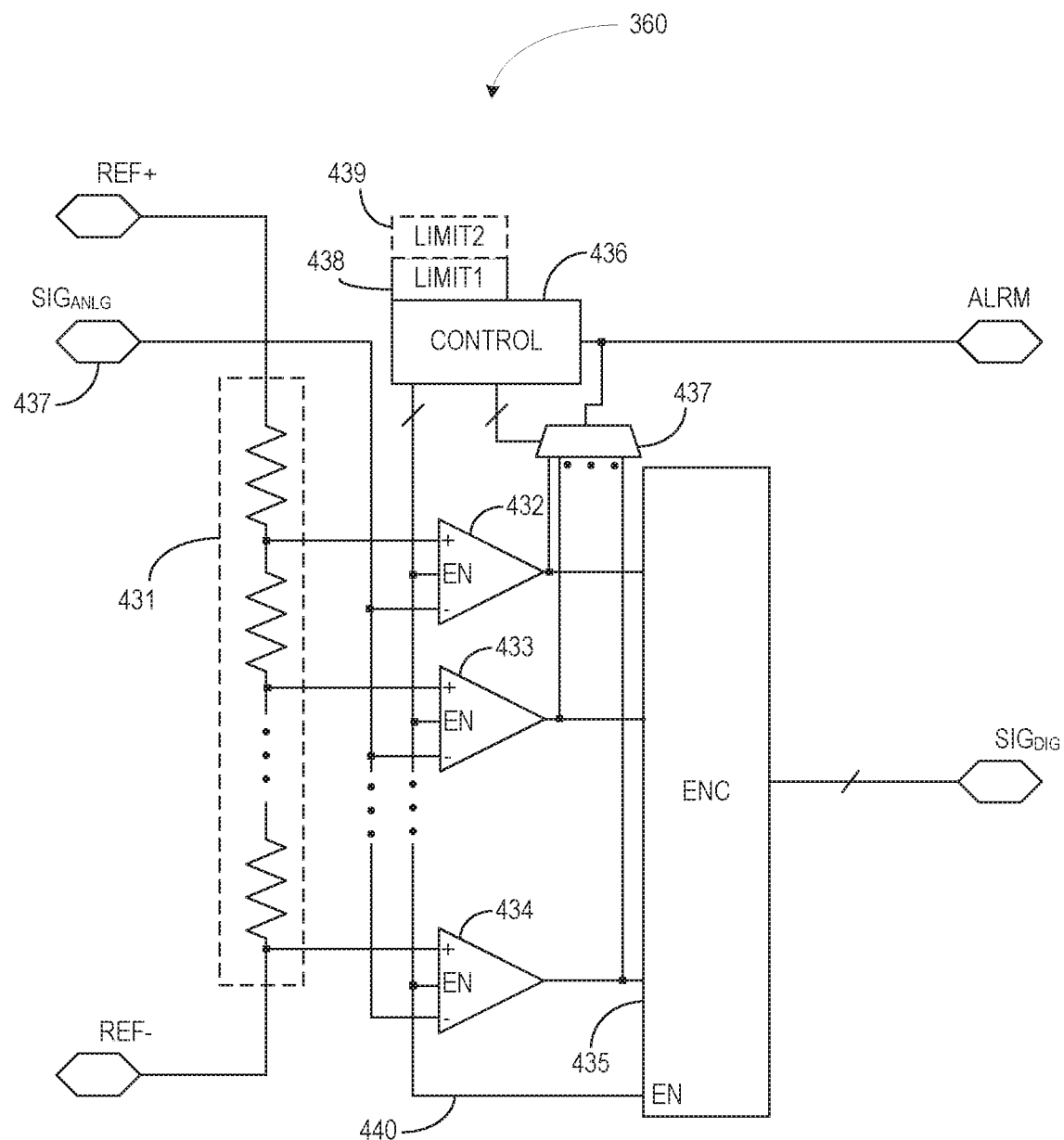
FIG. 4 illustrates generally an example flash ADC according to the present subject matter.

FIG. 4 illustrates generally an example flash ADC 460 according to the present subject matter. The flash ADC 460 can include a voltage divider 431 including a number of series connected resistors, a number of comparators 432, 433, 434, an encoder 435, and a controller 436. The flash ADC can also include a multiplexer 437, one or more registers 438, 439 and an enable bus 440. Each of the comparators 432, 433, 434 can have a first input coupled to a signal input of the flash ADC 460. The signal input can receive an analog signal ($SIG_{ANLG}$) of interest. A second input of the comparators 432, 433, 434 can be coupled individually to a different node of the voltage divider 431. The voltage divider 431 can include a number of resistors coupled in series between a first reference voltage (REF+) and a second reference voltage (REF−). The nodes of the voltage divider 431 coupled to the comparators 432, 433, 434 provide a decision level for each comparator upon which to base a comparison of the analog signal ($SIG_{ANLG}$) of interest. When the example flash ADC 460 is in an operating mode to provide a full digital conversion of the analog signal ($SIG_{ANLG}$), the encoder 435 can receive the output of each comparator 432, 433, 434 and provide a digital representation ($SIG_{DIG}$) of the analog signal ($SIG_{ANLG}$). Again, like the examples discussed above, continuously operating the flash ADC 460 to provide a full digital conversion of the analog signal ($SIG_{ANLG}$) can consume a relatively large amount of power. If employed in a system with a limited power source, such as a battery, operation of the flash ADC 460 can be a significant limit to the charge lifetime of the system.

In applications where the full digital conversion of the analog signal ($SIG_{ANLG}$) is not needed until the level of the analog signal ($SIG_{ANLG}$) crosses a threshold, the controller 436 of the example flash ADC 460 can enable and disable portions of the flash ADC 460 to provide a second, power-efficient, operating mode that provides a binary indication (ALRM) of a comparison of the analog signal ($SIG_{ANLG}$) with a predetermined or programmed decision level (LIMIT1, LIMIT2). The controller 436 can maintain operation of the flash ADC 460 in the second power-efficient operating mode until the comparison of the analog signal ($SIG_{ANLG}$) meets or exceeds the decision level. In certain examples, the controller 436 can have a register 438 with a digital representation of the decision level (LIMIT1). In the second power-efficient mode of operation, the controller 436 can disable the encoder 435 and all the comparators 432, 433, 434, etc., except for a comparator corresponding to the decision level (LIMIT1) to conserve power. In such an example, an individual enable signal via the enable bus 440 can be provided to each comparator 432, 433, 434, etc., from the controller 436. During the second operating mode, the controller 436 can connect the output of the corresponding comparator to the binary output node (ALRM) of the flash ADC 460 via the multiplexer 437. In an example, if the analog signal ($SIG_{ANLG}$) is below the analog decision level received by the corresponding comparator, the corresponding comparator can provide a low logic signal at the binary output node (ALRM). As the level of the analog signal ($SIG_{ANLG}$) rises past the analog decision level of the corresponding comparator, the logic level of the output of the corresponding comparator can transition from low to high. The controller 436, while operating in the second, power efficient mode of operation, can be responsive to the transition of the binary output node (ALRM) from low to high and can transition from the second, power-efficient mode of operation to the first, full digital conversion, mode of operation. In certain examples, the controller 436 can revert back to the second mode of operation after a predetermined delay interval. In some examples, the controller 436 can optionally receive the digital representation ($SIG_{DIG}$) of the analog signal ($SIG_{ANLG}$) and can transition back to the second mode of operation when the digital representation ($SIG_{DIG}$) falls below a second predetermined value (LIMIT1) of the register 438.

It is understood that the controller 436 can include a second register 439 including a second threshold (LIMIT2) to provide a window comparator such that, in a first example, low power operation can be employed when the analog signal ($SIG_{ANLG}$) is within the window defined by the values (LIMIT1, LIMIT2) of the first and second registers 438, 439, and, in a second example, low-power operation can be employed when the analog signal ($SIG_{ANLG}$) is outside the window. It is also understood that additional gating, possibly controlled by the controller 436, may be necessary to allow the controller 436 to be responsive to a desired comparator condition. For example, in an example providing windowed operation, additional gating maybe enabled by the controller 436 to ensure that the logic level of the outputs of the two enabled comparators are the same when the level of the analog signal ($SIG_{ANLG}$) is inside the window. In addition, the controller 436 can include a clock or oscillator to couple the outputs of the window operators to the binary output node (ALIBI) via the multiplexer 437 in an alternating fashion.

In certain examples, instead of having an output for each comparator, the controller can include a logic circuit or program that employs an additional output to provides an indication of the comparisons. For example, the output can show a first state (e.g., 00) to indicate the analog signal is below the window, a second state (e.g., 01) to indicate the analog signal is within the window, and a third state (e.g., 11) to indicate the analog signal is above the window.

Figure 5:
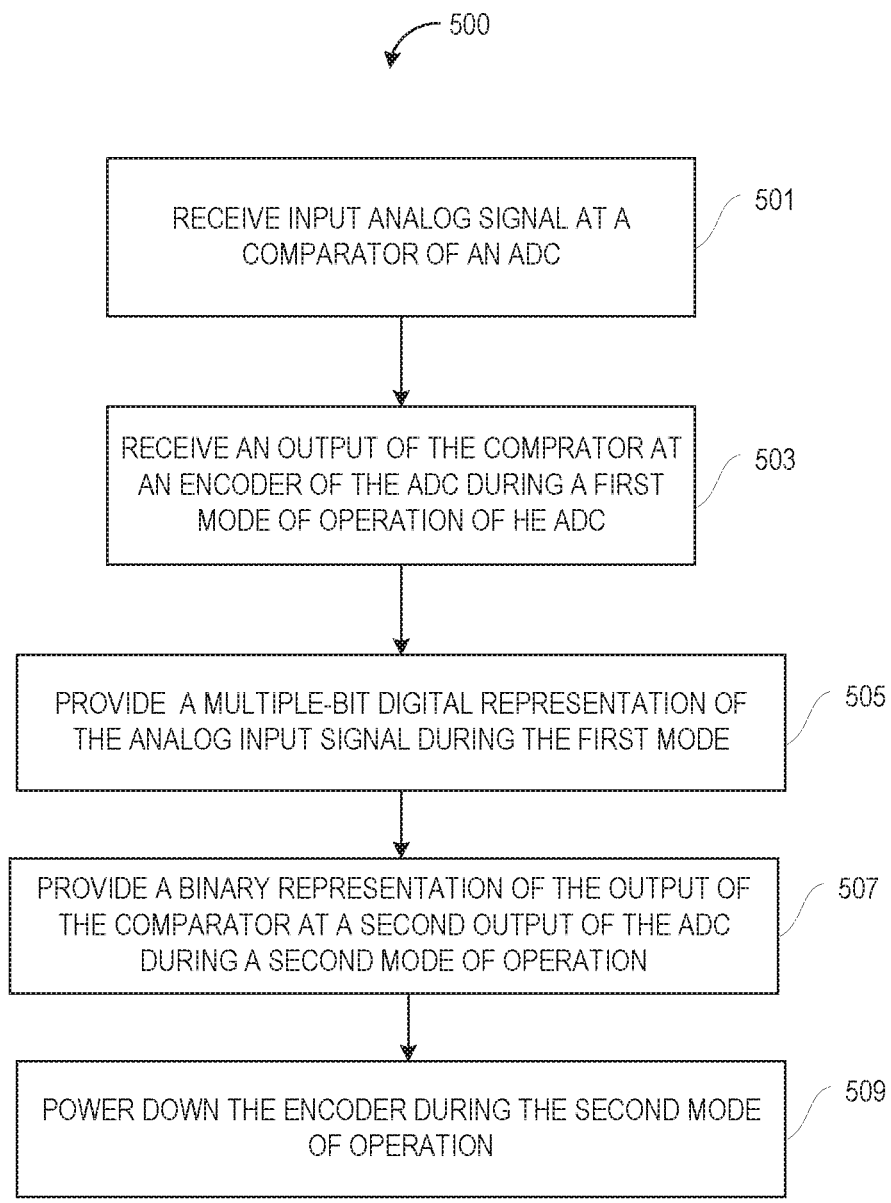
FIG. 5 illustrates generally a flowchart of an example of operating an example ADC according the present subject matter.

FIG. 5 illustrates generally a flowchart of an example method 500 of operating an example ADC according to the present subject matter. At 501, a representation of an analog input signal can be received at a comparator of the ADC. The representation can be an analog representation. At 503, the output of the comparator can be received at an encoder of the ADC during a first mode of operation of the ADC. At 505, during the first mode of operation of the ADC, the encoder circuit can provide a multiple-bit, digital representation of the analog input signal. At 507, during a second mode of operation of the ADC, a second output of the ADC can provide a binary representation of the comparator output. At 509, during the second mode of operation of the ADC, the encoder can be disabled to conserve power. In certain examples, a controller of the ADC can be responsive to the output of the comparator during the second mode to transition the operation of the ADC to the first mode. For example, during the second mode of operation, the controller can select that the output of the comparator represents the result of a comparison of the analog input signal with a threshold or limit. As long as the level of the analog input signal does not violate the limit, the controller maintains operation of the ADC in a low-power comparator mode. Upon the level of the analog signal violating the threshold or limit, the controller can transition operation of the ADC to the first mode; full multiple-bit digital conversion of the analog input signal. Transition of the ADC from the second mode to the first mode can include enabling or providing power to certain components of the ADC. Such components can include, but are not limited to, one or more SAR registers, other components not used to provide the binary comparison f the second mode, or combinations thereof. In certain examples, the controller can maintain operation of the ADC in the first mode until the level of the analog signal no longer violates the threshold. In certain examples, the controller may include additional logic and comparators not discussed herein but within the knowledge of persons of skill in the art. In some examples, upon entering the first mode the controller can automatically switch to the second mode via the expiration of a timer initiated upon entry into the first mode. In some examples, the controller can be responsive to a signal external to the ADC to initiate transition to the second mode of operation. In some examples, the ADC can include more than one threshold.

Various Notes & Examples

In a first example, Example 1, a circuit can include an analog-to-digital converter (ADC) configured to provide a multiple-bit digital representation of an analog input signal during a first mode of operation, an output configured to provide a single bit representation of a first comparison of the analog input signal to a second analog signal during a second mode of operation, and an encoder configured to provide the multiple-bit digital representation during the first mode and to power down in response to the second mode of operation.

In Example 2, the ADC of Example 1 optionally includes a pipeline sequential approximation register (SAR) ADC circuit.

In Example 3, the circuit of any one or more of Examples 1-2 optionally includes an input configured to receive the second analog signal.

In Example 4, the ADC of any one or more of Examples 1-3 optionally includes a sequential approximation register (SAR) configured to save results of sequential comparisons of the analog input signal during the first mode.

In Example 5, the SAR of any one or more of Examples 1-4 optionally is configured to power down during the second mode.

In Example 6, the ADC of any one or more of Examples 1-5 optionally includes a comparator to execute the sequential comparisons and to provide the results of the sequential comparisons during the first mode.

In Example 7, the ADC of any one or more of Examples 1-6 optionally includes a feedback digital to analog converter (DAC) configured to provide a first analog decision level signal to the comparator during the first mode, the first analog decision level signal based on a value of the SAR during the first mode.

In Example 8, the comparator of any one or more of Examples 1-7 optionally is configured to execute the first comparison and to provide the single bit representation during the second mode.

In Example 9, the ADC of any one or more of Examples 1-8 optionally is a flash ADC.

In Example 10, a method for operating an ADC circuit can include receiving an analog signal at an input of the ADC circuit, receiving the analog signal at a comparator of the ADC circuit, receiving an output of the comparator at an input of an encoder circuit of the ADC circuit during a first mode, providing a digital representation from an output of the encoder circuit during the first mode, providing a binary representation of the output of the comparator at second output of the ADC circuit during a second mode, and powering down the encoder circuit during the second mode.

In Example 11, the ADC circuit of any one or more of Examples 1-10 optionally is a flash ADC circuit.

In Example 12, the method of any one or more of Examples 1-11 optionally includes selecting the comparator from a plurality of comparators of the flash ADC circuit.

In Example 13, the ADC circuit of any one or more of Examples 1-12 optionally is a sequential approximation register (SAR) ADC circuit.

In Example 14, the method of any one or more of Examples 1-13 optionally includes powering down the sequential approximation register of the SAR ADC circuit during the second mode.

In Example 15, the method of any one or more of Examples 1-14 optionally includes receiving a decision level at the comparator from a feedback DAC of the SAR ADC circuit.

In Example 16, the method of any one or more of Examples 1-15 optionally includes receiving a digital representation of the decision level from the SAR during the first mode.

In Example 17, the method of any one or more of Examples 1-2 optionally includes receiving a digital representation of the decision level from a second register of the SAR ADC circuit during the second mode.

In Example 18, an analog-to-digital converter (ADC) circuit can include means for receiving an analog input signal, means for providing a digital representation of the analog input signal during a first mode, means for comparing the analog input signal to a decision level and providing a binary output representative of a comparison result during a second mode, and means for powering down a portion of the means for providing the digital representation during the second mode.

In Example 19, the means for comparing the analog input signal to a decision level and providing a binary output representative of the comparison result during a second mode of any one or more of Examples 1-8 optionally includes a comparator of a sequential approximation register (SAR) ADC.

In Example 20, the means for comparing the analog input signal to a decision level and providing a binary output representative of the comparison result during a second mode of any one or more of Examples 1-19 optionally includes one of a plurality of comparators of a flash ADC.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more," In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by, one of ordinary skill in the art upon reviewing the above description. The Abstract is provided to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A circuit comprising:
    an analog-to-digital converter (ADC) configured to provide a multiple-bit representation of an analog input signal during a first mode of operation;
    an output configured to provide a single-bit representation of a first comparison result of the analog input signal to a second analog signal during a second mode of operation; and
    an encoder configured to provide the multiple-bit representation during the first mode and to power down during the second mode of operation.

2. The circuit of claim 1, wherein the ADC includes a pipeline ADC that comprises first and second sequential approximation register (SAR) circuits, wherein the multiple-bit representation comprises information from each of the first and second SAR circuits.

3. The circuit of claim 2, further comprising an encoder circuit configured to receive signals from the first and second SAR circuits and, in response, provide the multiple-bit representation of the analog input signal during the first mode operation.

4. The circuit of claim 3, wherein the encoder circuit is configured to power down during the second mode of operation.

5. The circuit of claim 2, wherein the first SAR circuit comprises:
    a comparator;
    a register configured to receive a comparison result signal from the comparator;
    a residual output coupled to the second SAR circuit; and
    a digital-to-analog converter (DAC) configured to provide, to the comparator, a first feedback signal in the first mode of operation and a second feedback signal in the second mode of operation, wherein the first feedback signal is based on the comparison result signal and the second feedback signal is based on the second analog signal.

6. The circuit of claim 5, wherein the second SAR circuit is configured to power down during the second mode of operation.

7. The circuit of claim 6, wherein the register in the first SAR circuit is configured to power down during the second mode of operation.

8. The circuit of claim 5, wherein the second analog signal comprises a lower limit signal and an upper limit signal.

9. The circuit of claim 1, wherein the ADC comprises:
a first sequential approximation register (SAR) configured to save results of sequential comparisons of the analog input signal during the first mode; and
a comparator configured to execute the sequential comparisons and to provide the results of the sequential comparisons during the first mode;
wherein the first SAR is configured to power down during the second mode of operation.

10. The circuit of claim 9, wherein the ADC includes a feedback digital to analog converter (DAC) configured to provide a first feedback signal to the comparator during the first mode, the first feedback signal based on a value of the SAR during the first mode.

11. The circuit of claim 9, wherein the comparator is configured to provide the single bit representation during the second mode.

12. The circuit of claim 1, wherein the ADC is a flash ADC.

13. A method for operating a multiple-mode pipeline ADC circuit, the method comprising:
receiving an analog input signal at an input of the pipeline ADC circuit;
in a first operation mode,
providing information about the analog input signal to first and second sequential approximation register (SAR) circuits;
receiving, at an encoder, information from the first and second SAR circuits about the analog input signal; and
providing, using the encoder and in response to the information from the first and second SAR circuits, a multiple-bit representation of the analog input signal at a first output of the pipeline ADC circuit; and
in a second operation mode,
using the first SAR circuit, providing a representation of a comparison result of the analog input signal with a reference value.

14. The method of claim 13, comprising, in the second operation mode, powering down the second SAR circuit and the encoder.

15. The method of claim 13, wherein providing the representation of the comparison result of the analog input signal with the reference value includes providing a binary representation signal.

16. The method of claim 13, comprising receiving information about the reference value from a feedback digital-to-analog converter (DAC) in the first SAR circuit in response to one or more reference signals.

17. The method of claim 13, wherein providing information about the analog input signal to the first and second SAR circuits includes providing a first portion of the analog input signal to the first SAR circuit and providing a residual error portion of the analog input signal to the second SAR circuit.

18. A multiple-mode pipeline analog-to-digital converter (ADC) circuit comprising:
means for receiving an analog input signal;
means for providing a multiple-bit representation of the analog input signal during a first mode;
means for providing a binary representation of a comparison result of the analog input signal and a decision level signal during a second mode; and
means for powering down a portion of the means for providing the multiple-bit representation during the second mode.

19. The ADC circuit of claim 18, wherein the means for providing the binary representation include a comparator of a sequential approximation register (SAR) circuit.

20. The ADC circuit of claim 18, wherein the means for providing the multiple-bit representation include a series of at least first and second sequential approximation register (SAR) circuits, wherein the second SAR circuit is responsive to a residual error from the first SAR circuit.

21. The ADC circuit of claim 20, wherein the means for powering down include means for powering down the second SAR circuit without powering down the first SAR circuit.

* * * * *